(12) United States Patent
Kitayama

(10) Patent No.: US 11,450,533 B2
(45) Date of Patent: Sep. 20, 2022

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Fumiaki Kitayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 347 days.

(21) Appl. No.: 15/735,305

(22) PCT Filed: Jul. 14, 2016

(86) PCT No.: PCT/JP2016/003329
§ 371 (c)(1),
(2) Date: Dec. 11, 2017

(87) PCT Pub. No.: WO2017/010102
PCT Pub. Date: Jan. 19, 2017

(65) Prior Publication Data
US 2018/0174857 A1  Jun. 21, 2018

(30) Foreign Application Priority Data
Jul. 16, 2015 (JP) .............................. JP2015-142385

(51) Int. Cl.
*H01L 21/311* (2006.01)
*G03F 7/00* (2006.01)
(Continued)

(52) U.S. Cl.
CPC .... *H01L 21/31127* (2013.01); *B29C 35/0888* (2013.01); *G03F 7/0002* (2013.01); *H01L 21/67092* (2013.01)

(58) Field of Classification Search
CPC .................. H01L 21/31127; B29C 35/0888
(Continued)

(56) References Cited

U.S. PATENT DOCUMENTS 6,646,662 B1 * 11/2003 Nebashi .................... B44C 1/22
257/E21.314
8,404,170 B2   3/2013 Koole et al.
(Continued)

FOREIGN PATENT DOCUMENTS

JP         56092810 A    5/1985
JP       2000194142 A    7/2000
(Continued)

OTHER PUBLICATIONS

Science Direct: Two-Step curing method for demoulding in UV nanoimprint lithography; Weitao Jiang *, Yucheng Ding, Hongzhong Liu, Bingheng Lu, Yongsheng Shi, Jinyou Shao, Lei Yin/The State Key Lab for Manufacturing Systems Engineering, Xi'an Jiaotong University, Xi'an 710049, China (Year: 2007).*

(Continued)

*Primary Examiner* — Francisco W Tschen
*Assistant Examiner* — Wayne K. Swier
(74) *Attorney, Agent, or Firm* — Rossi, Kimms & McDowell LLP

(57) ABSTRACT

An imprint apparatus cures an imprint material supplied onto a substrate held by a substrate holder by bringing a mold held by a mold holder into contact with the imprint material. The imprint apparatus includes an adjuster to adjust a distance between the substrate holder and the mold holder for contact and separation between the imprint material and the mold, an energy supply tool to supply, to the imprint material, energy for curing the imprint material supplied onto the substrate held by the substrate holder, and a controller to control the adjuster and the energy supply tool. The controller controls the adjuster so as to start separation between the imprint material and the mold in a period during which the energy supply tool supplies the (Continued)

energy to the imprint material that is in contact with the mold.

7 Claims, 10 Drawing Sheets

(51) Int. Cl.
  *B29C 35/08* (2006.01)
  *H01L 21/67* (2006.01)
(58) Field of Classification Search
  USPC .......................................................... 264/496
  See application file for complete search history.

(56) References Cited

U.S. PATENT DOCUMENTS

| | | | | |
|---|---|---|---|---|
| 8,414,279 | B2* | 4/2013 | Kawakami | B82Y 40/00 264/293 |
| 9,927,700 | B2 | 3/2018 | Murakami | |
| 2002/0093122 | A1* | 7/2002 | Choi | B29C 43/021 264/401 |
| 2008/0018024 | A1* | 1/2008 | Kataho | G11B 7/261 264/485 |
| 2008/0241418 | A1* | 10/2008 | Allen | B82Y 40/00 427/559 |
| 2009/0098688 | A1* | 4/2009 | Okushima | B29C 43/021 438/127 |
| 2010/0052217 | A1* | 3/2010 | Kasumi | B82Y 10/00 264/293 |
| 2011/0037201 | A1* | 2/2011 | Koole | B82Y 40/00 264/447 |
| 2011/0068504 | A1 | 3/2011 | Tobise | |
| 2013/0176146 | A1 | 7/2013 | Dusparic et al. | |

FOREIGN PATENT DOCUMENTS

| | | |
|---|---|---|
| JP | 2007081048 A | 3/2007 |
| JP | 2007115801 A | 5/2007 |
| JP | 2011049554 A | 3/2011 |
| JP | 2011062978 A | 3/2011 |
| JP | 2012206504 A | 10/2012 |
| JP | 2013069921 A | 4/2013 |
| JP | 2015072952 A | 4/2015 |

OTHER PUBLICATIONS

Jiang, Weitao, et. al. "Two-Step curing method for demoulding in UV nanoimprint lithography", The State Key Lab for Manufacturing Systems Engineering, XI'an Jiaotong University, Xi'an 710049, China; Published in Microelectronic Engineering 85 (2008) pp. 458-464 available online at www.sciencedirect.com (Year: 2008).*
International Search Report issued in Intl. Appln. No. PCT/JP2016/003329 dated Oct. 18, 2016.
Written Opinion issued in Intl. Appln. No. PCT/JP2016/003329 dated Oct. 18, 2016.
Office Action issued in Japanese Appln. No. 2015-142385 dated May 13, 2019.

* cited by examiner

US 11,450,533 B2

IMPRINT APPARATUS, IMPRINT METHOD, AND ARTICLE MANUFACTURING METHOD

TECHNICAL FIELD

The present invention relates to an imprint apparatus, an imprint method, and an article manufacturing method.

BACKGROUND ART

As a new technique for manufacturing an article such as a semiconductor device or MEMS (Micro Electro Mechanical Systems), an imprint technique has received attention. The imprint technique is a technique of forming a pattern on a substrate by supplying an imprint material onto the substrate, and curing the imprint material while a mold is in contact with the imprint material (for example, Japanese Patent Laid-Open No. 2000-194142). If a pattern having a concave portion is formed on the mold and the mold is brought into contact with the imprint material, the concave portion is filled with the imprint material. The imprint material is cured after the concave portion is filled with the imprint material. The imprint material is cured by supplying energy such as light energy or heat energy to the imprint material.

In the present imprint technique, it takes a long time to complete separation between the imprint material and the mold since the mold is brought into contact with the imprint material on the substrate, resulting in a low throughput.

SUMMARY OF INVENTION

One aspect of the present invention provides an imprint apparatus and imprint method advantageous in improving the throughput.

One of aspects of the present invention provides an imprint apparatus for curing an imprint material supplied onto a substrate held by a substrate holder by bringing a mold held by a mold holder into contact with the imprint material, the apparatus comprising: an adjuster configured to adjust a distance between the substrate holder and the mold holder for contact and separation between the imprint material and the mold; an energy supply tool configured to supply, to the imprint material, energy for curing the imprint material supplied onto the substrate; and a controller configured to control the adjuster and the energy supply tool, wherein the controller controls the adjuster so as to start separation between the imprint material and the mold in a period during which the energy supply tool supplies the energy to the imprint material that is in contact with the mold.

Further features of the present invention will become apparent from the following description of exemplary embodiments with reference to the attached drawings.

DESCRIPTION OF EMBODIMENTS

The present invention will be described below using exemplary embodiments.

Figure 1:
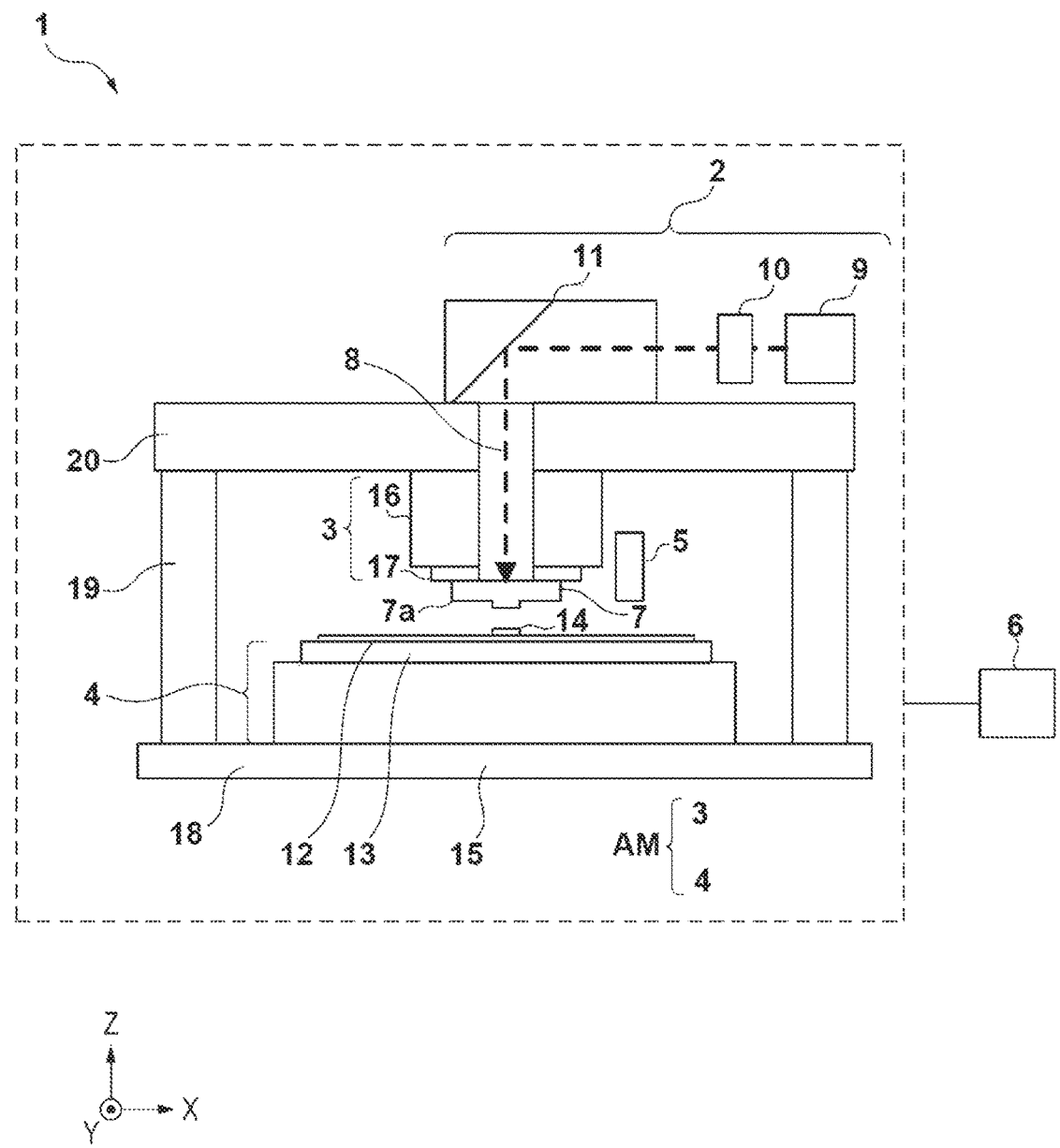
FIG. 1 is a view schematically showing the arrangement of an imprint apparatus according to an embodiment of the present invention.

FIG. 1 schematically shows the arrangement of an imprint apparatus 1 according to an embodiment of the present invention. The imprint apparatus 1 is configured to cure an imprint material 14 supplied onto a substrate 12 by bringing a mold 7 into contact with the imprint material 14. In this specification, directions will be explained in an XYZ coordinate system having the XY plane along the surface of the substrate 12. The X, Y, and Z directions are respectively parallel to the X-, Y-, and Z-axes that define the XYZ coordinate system. The imprint apparatus 1 can include an energy supply tool 2, a mold moving mechanism 3, a substrate moving mechanism 4, an imprint material supply tool 5 (dispenser), and a controller 6.

The energy supply tool 2 supplies, to the imprint material 14, energy for curing the imprint material 14. In this embodiment, the imprint material 14 is a photo-curing material such as a photo-curing resin. To cure the imprint material 14, the energy supply tool 2 supplies energy (for example, ultraviolet light) 8 to the imprint material 14 (the energy supply tool 2 irradiates the imprint material 14 with the light 8). The energy supply tool 2 includes a light source (energy source) 9, an optical system 11 for adjusting the light (energy) 8 from the light source 9, and a supply controller 10 for controlling supply of the light 8 to the imprint material 14 (irradiation of the imprint material 14 with the light 8). The light source 9 can be, for example, a lamp such as a high pressure mercury lamp, an ultraviolet light emitting device such as an ultraviolet LED, an excimer lamp, or an excimer laser. The light 8 has a wavelength to pass through the mold 7 and cure the imprint material 14. The optical system 11 can include, for example, a lens, mirror, and/or aperture. The supply controller 10 may be, for example, a mirror or shutter that passes or blocks the light 8 from the light source 9, or a driving circuit that drives the light source 9. The supply controller 10 is used to control the irradiation dose (supply amount) of the light 8 (energy) for the imprint material 14. The energy for curing the imprint material 14 may be, for example, heat. In this case, the imprint material 14 is a thermosetting material such as a thermosetting resin.

The mold moving mechanism 3 can include a mold holder 17 that holds the mold 7, and a driver 16 that drives the mold holder 17 about a plurality of axes (for example, the X-, Y-, and X-axes, and rotations about the X-, Y-, and X-axes). The substrate moving mechanism 4 can include a substrate holder 13 that holds the substrate 12, and a driver 15 that drives the substrate holder 13 about a plurality of axes (for example, the X- and Y-axes and rotation about the Z-axis). The mold moving mechanism 3 and/or substrate moving mechanism 4 forms an adjuster AM that adjusts the distance between the substrate holder 13 and the mold holder 17 for contact and separation between the mold 7 and the imprint material 14 on the substrate 12. In an example, the adjuster AM that adjusts the distance between the substrate holder 13 and the mold holder 17 for contact and separation between the mold 7 and the imprint material 14 on the substrate 12 can be implemented by the mold moving mechanism 3 that is configured to drive the mold 7 in the Z-axis direction. In another example, the adjuster AM that adjusts the distance between the substrate holder 13 and the mold holder 17 for contact and separation between the mold 7 and the imprint material 14 on the substrate 12 can be implemented by the substrate moving mechanism 4 that is configured to drive the substrate 12 in the Z-axis direction.

The mold 7 can also be referred to as an original or template. The mold 7 includes a pattern portion 7a, and the pattern portion 7a includes a pattern having a concave portion. The mold 7 can be made of a material that passes the light 8, for example, quartz. The substrate 12 is a member having a plate shape, and can be, for example, a semiconductor substrate such as a single-crystal silicon substrate or SOI (Silicon on Insulator) substrate, or an insulating substrate such as a glass substrate.

The imprint material supply tool 5 (dispenser) is configured to supply the imprint material 14 onto the substrate 12. The imprint material supply tool 5 typically supplies the imprint material 14 to a shot region as an imprint target defined on the substrate 12. In an example, the imprint material supply tool 5 includes a plurality of orifices (nozzles) for discharging the fluid imprint material 14, and discharges the imprint material 14 from the plurality of nozzles in synchronism with scanning of the substrate 12 by the substrate moving mechanism 4. This supplies the imprint material 14 to the shot region as a target on the substrate 12. The discharge amount of the imprint material 14 from each nozzle is determined based on the film thickness of the imprint material 14 to be formed on the substrate 12, the density of the concave portion forming the pattern of the mold 7, and the like.

The controller 6 controls the energy supply tool 2, mold moving mechanism 3, substrate moving mechanism 4, and imprint material supply tool 5. The controller 6 can be formed by, for example, a PLD (Programmable Logic Device) such as an FPGA (Field Programmable Gate Array), an ASIC (Application Specific Integrated Circuit), a general-purpose computer incorporating programs, or a combination of all or some of them.

In addition, the imprint apparatus 1 can include a base plate 18 that supports the substrate moving mechanism 4, a support plate 20 that supports the mold moving mechanism 3, and a column 19 that supports the support plate 20 on the base plate 18. The imprint apparatus 1 can also include a mold conveyance mechanism for conveying the mold 7 between a mold load/unload port and the mold holder 17, and a substrate conveyance mechanism for conveying the substrate 12 between a substrate load/unload port and the substrate holder 13.

Figure 2:
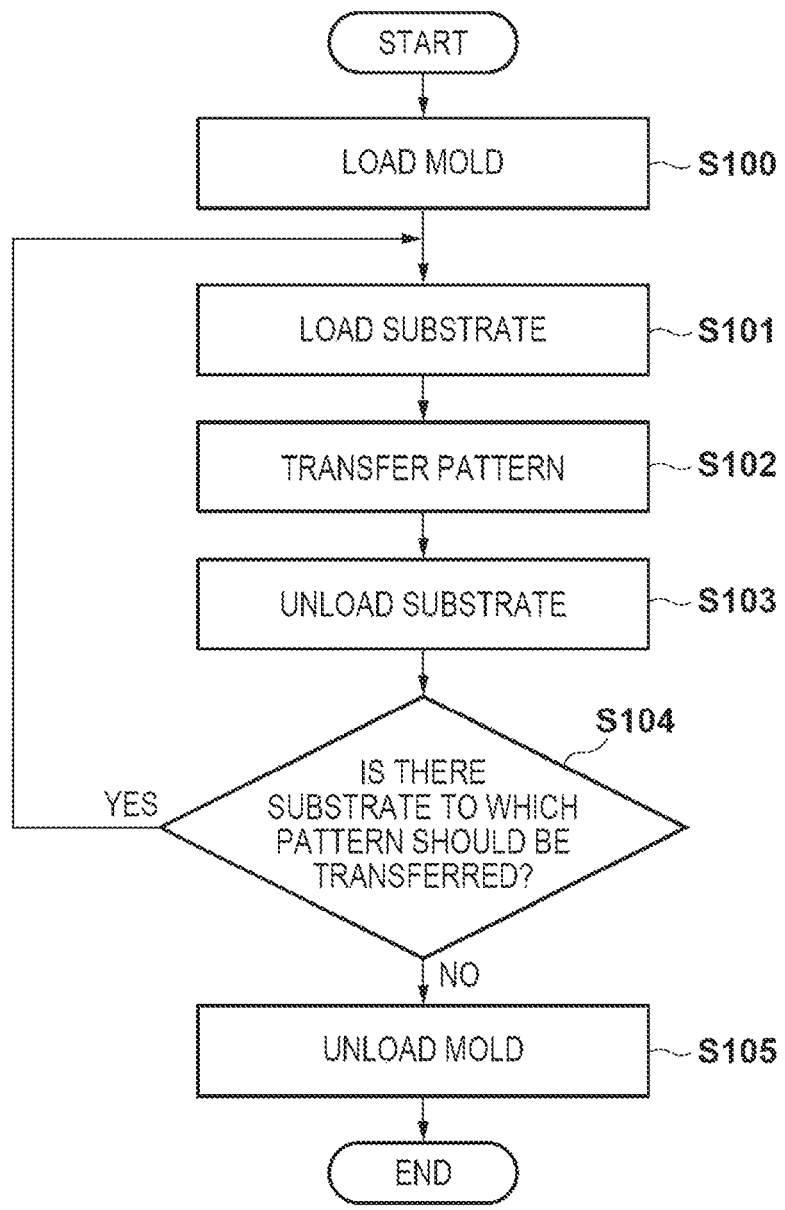
FIG. 2 is a flowchart illustrating the operation of the imprint apparatus.

The operation of the imprint apparatus 1 will be described with reference to FIG. 2. The controller 6 controls the operation illustrated in FIG. 2. In step S100, the controller 6 controls the mold conveyance mechanism to convey the mold 7 from the mold load/unload port to the mold holder 17, and controls the mold holder 17 to hold the mold 7. In step S101, the controller 6 controls the substrate conveyance mechanism to convey the substrate 12 from the substrate load/unload port to the substrate holder 13, and controls the substrate holder 13 to hold the substrate 12. In step S102, the controller 6 controls processing (imprint processing) of transferring the pattern of the pattern portion 7a of the mold 7 to each of a plurality of shot regions of the substrate 12. An operation for transferring the pattern to each shot region includes supply of the imprint material 14 to the shot region, contact of the mold 7 with the imprint material 14 in the shot region, curing of the imprint material 14, and separation between the imprint material 14 and the mold 7. The processing in step S102 will be described later.

In step S103, the controller 6 controls the substrate conveyance mechanism to convey the substrate 12 from the substrate holder 13 to the substrate load/unload port. In step S104, the controller 6 determines whether processing has ended for all substrates 12 (typically, all substrates of one lot) expected to be processed. If there is an unprocessed substrate 12, the controller 6 returns to step S101 to process the unprocessed substrate 12. If the imprint processing has ended for all the substrates 12 expected to be processed, the controller 6 causes, in step S105, the mold conveyance mechanism to receive the mold 7 from the mold holder 17 and convey it to the mold load/unload port.

The processing in step S102 will be described below. The imprint apparatus 1 has the first and second modes as modes selectable in execution of step S102. The timing of separation between the imprint material 14 and the mold 7 is different between the first and second modes. In the first mode, after supply of energy from the energy supply tool 2 to the imprint material 14 stops, that is, after energy is no longer supplied from the energy supply tool 2 to the imprint material 14, the imprint material 14 and the mold 7 are separated. In the second mode, the imprint material 14 and the mold 7 are separated while the energy supply tool 2 supplies energy to the imprint material 14. The second mode is a characteristic mode in this embodiment.

Figure 3:
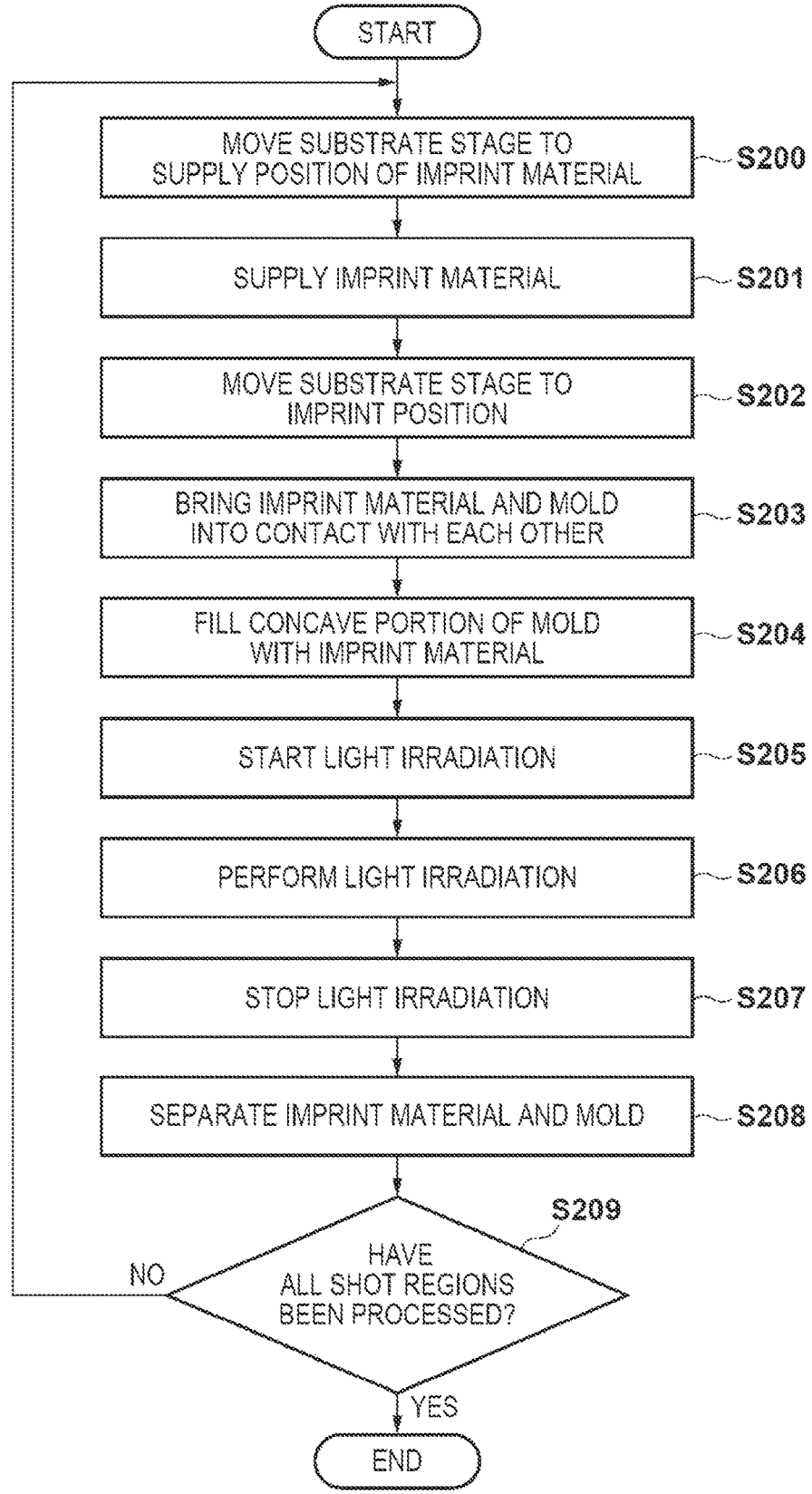
FIG. 3 is a flowchart illustrating the operation of the imprint apparatus in the first mode.

The operation in the first mode will be described with reference to FIG. 3. In step S200, the controller 6 controls the substrate moving mechanism 4 so as to arrange the shot region as an imprint target of the substrate 12 at the supply position of the imprint material 14 by the imprint material supply tool 5. In step S201, the controller 6 controls the imprint material supply tool 5 and the substrate moving mechanism 4 so as to supply the imprint material 14 to the shot region as an imprint target of the substrate 12.

Figure 10A:
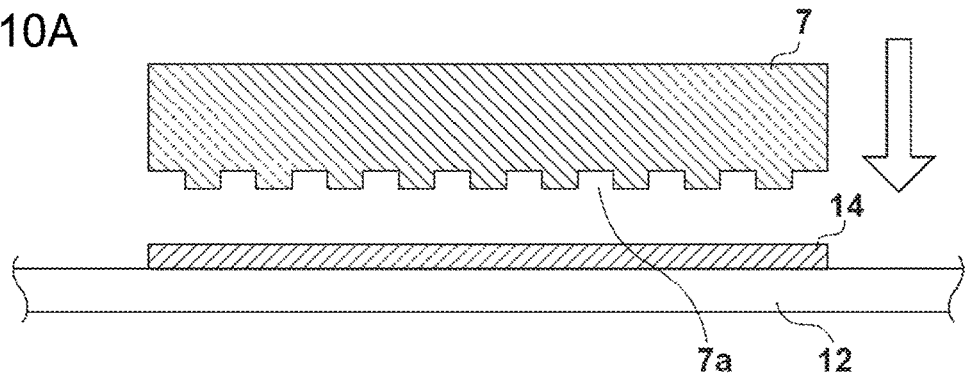
FIG. 10A is a view showing the schematic procedure of imprinting.
Figure 10B:
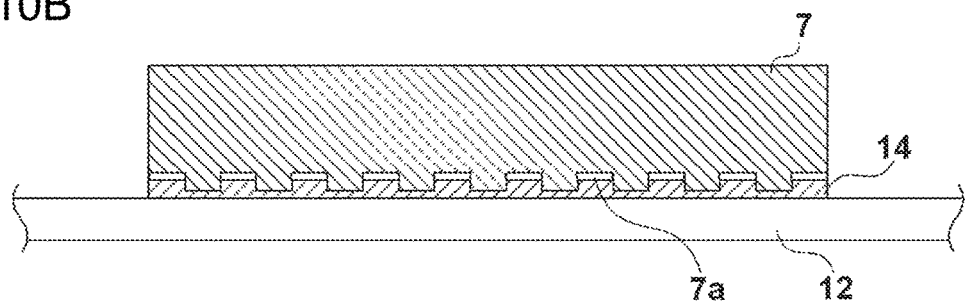
FIG. 10B is a view showing the schematic procedure of imprinting.

In step S202, the controller 6 controls the substrate moving mechanism 4 so as to arrange the shot region as an imprint target of the substrate 12 below the mold 7. In step S203, the controller 6 controls the mold moving mechanism 3 and the substrate moving mechanism 4 so as to align the mold 7 with the shot region as an imprint target of the substrate 12. In step S203 (contact step), the controller 6 causes the adjuster AM to adjust the distance between the substrate holder 13 and the mold holder 17 so as to bring the mold 7 into contact with the imprint material 14 on the shot region as an imprint target. In an example, the controller 6 controls the mold moving mechanism 3 serving as a component of the adjuster AM so as to bring the mold 7 into contact with the imprint material 14 on the shot region as an imprint target, that is, so as to move the mold 7 downward, as schematically shown in FIG. 10A. In step S204, the controller 6 waits until the concave portion of the pattern portion 7a of the mold 7 is filled with the imprint material 14, as schematically shown in FIG. 10B.

Figure 10C:
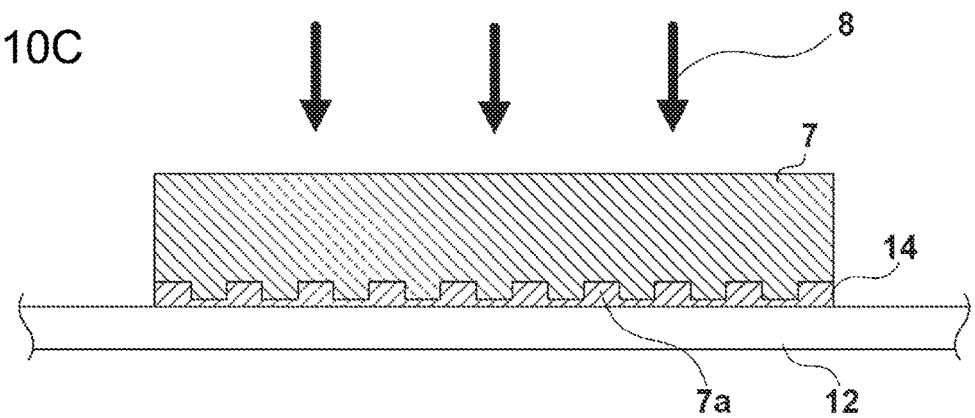
FIG. 10C is a view showing the schematic procedure of imprinting.

In step S205 (supply start step), the controller 6 controls the energy supply tool 2 so as to start supply of energy for curing the imprint material 14 to the imprint material 14 on the shot region, as schematically shown in FIG. 10C. For example, the controller 6 sends, to the supply controller 10 of the energy supply tool 2, a start instruction to instruct the start of supply of energy. In accordance with the start instruction, the supply controller 10 executes an operation for starting supply of the energy (light 8) to the imprint material 14. If the supply controller 10 includes a shutter, it drives the shutter from a closed state to an opened state in accordance with the start instruction. In this specification, the closed state indicates a state in which the shutter is completely closed, and the opened state indicates a state in which the shutter is completely opened. A corresponding delay occurs from when the supply controller 10 receives the start instruction until the state of the shutter changes from the closed state to the opened state in response to the start instruction. In step S206, to ensure that a predetermined amount of energy is supplied to the imprint material 14, the controller 6 waits until the first wait time (T1+T2 (to be described alter)) elapses. In step S207, the controller 6 controls the energy supply tool 2 so as to stop the supply of the energy to the imprint material 14. For example, the controller 6 sends, to the supply controller 10 of the energy supply tool 2, a stop instruction to instruct the stop of the supply of the energy. In accordance with the stop instruction, the supply controller 10 executes an operation for stopping the supply of the energy to the imprint material 14. If the supply controller 10 includes a shutter, it drives the shutter from the opened state to the closed state in accordance with the stop instruction. A corresponding delay occurs from when the supply controller 10 receives the stop instruction until the state of the shutter changes from the opened state to the closed state in response to the stop instruction. The first wait time in step S206 is determined so that the integrated value of the supply amount of the energy to the imprint material 14 becomes a value necessary to sufficiently cure the imprint material 14.

Figure 10D:
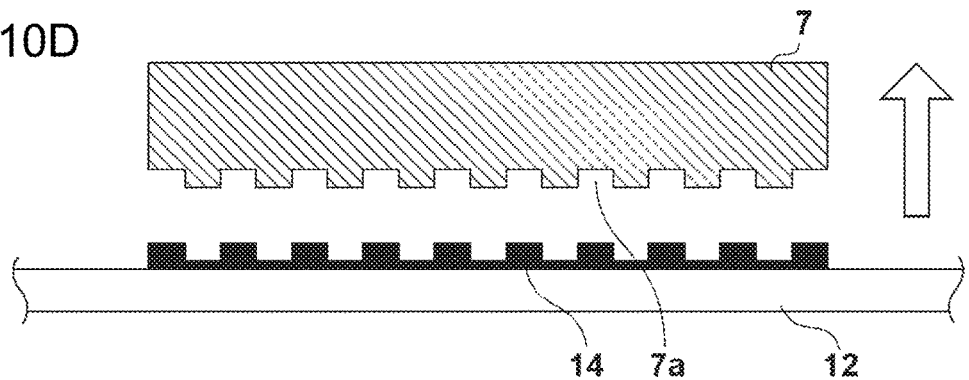
FIG. 10D is a view showing the schematic procedure of imprinting.

In step S208 (separation start step), the controller 6 causes the adjuster AM to adjust the distance between the substrate holder 13 and the mold holder 17 so as to separate the cured imprint material 14 and the mold 7, as schematically shown in FIG. 10D. In an example, the controller 6 controls the mold moving mechanism 3 serving as a component of the adjuster AM so as to separate the mold 7 and the imprint material 14 on the shot region as an imprint target, that is, so as to move the mold 7 upward.

In step S209, the controller 6 determines whether the imprint processing has ended for all the shot regions to which the pattern should be formed. If there is an unprocessed shot region, the controller 6 returns to step S200 to process the unprocessed shot region. If the imprint processing has ended for all the shot regions to which the pattern should be formed, the controller 6 ends the processing shown in FIG. 3 (that is, the processing in step S102 in the first mode).

Figure 5:
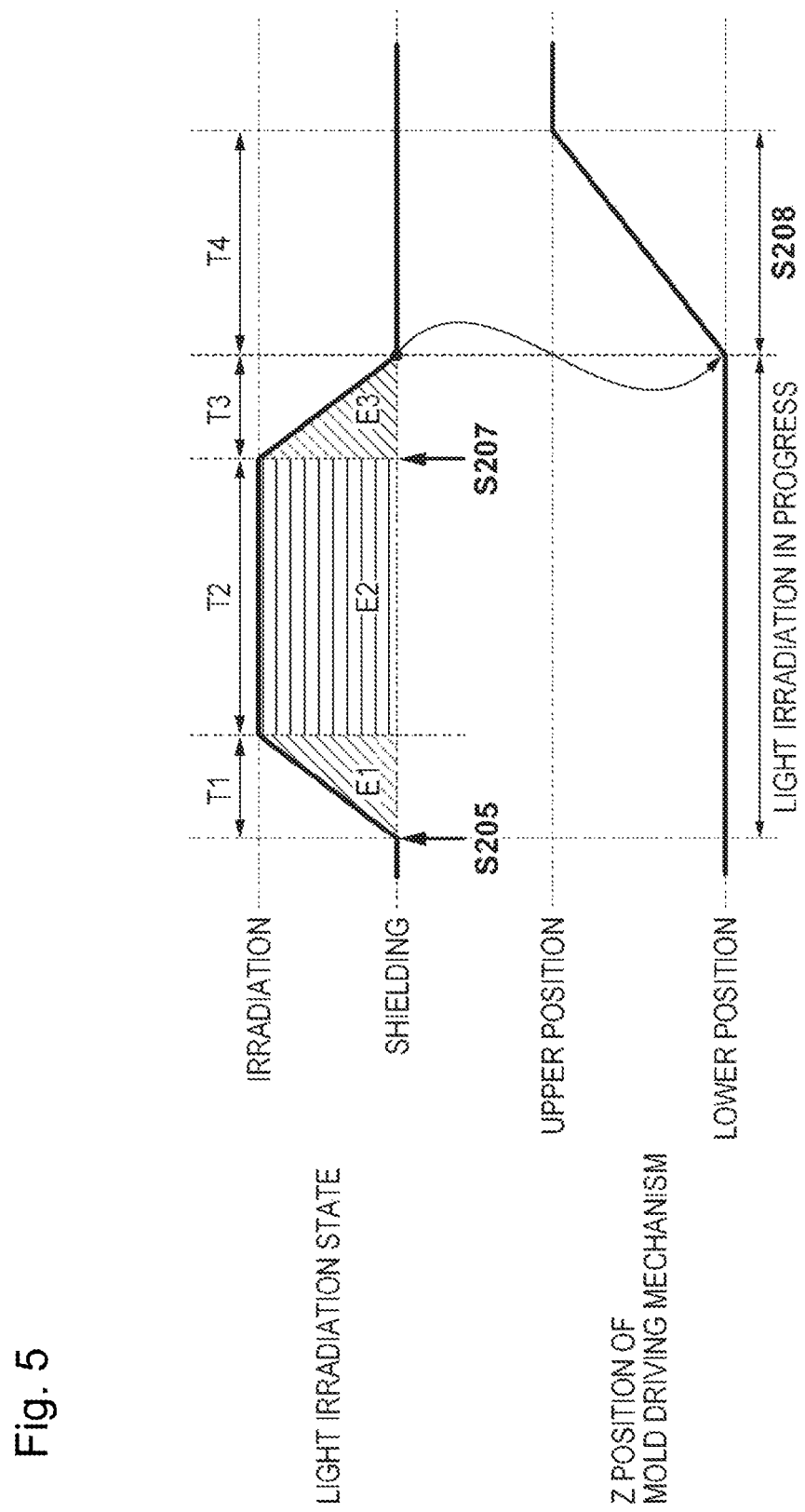
FIG. 5 is a timing chart showing supply of energy (light) to an imprint material and the timing of separation between a resin and a mold in the first mode.

FIG. 5 shows the supply of the energy (light) to the imprint material 14 and the timing of separation between the imprint material 14 and the mold 7 in the first mode. FIG. 5 exemplifies the supply state of the energy by the supply controller 10 of the energy supply tool 2, that is, the light irradiation state. In FIG. 5, "irradiation" indicates a state in which the imprint material 14 is irradiated with light of a target intensity, and "shielding" indicates a state in which the imprint material 14 is not irradiated with light. A section between "irradiation" and "shielding" is a section in which the imprint material 14 is irradiated with light of an intensity lower than the target intensity and, more specifically, a section between the opened and closed states of the shutter of the supply controller 10.

A period during which the energy supply tool 2 supplies the energy to the imprint material 14 that is in contact with the mold 7 includes the first, second, and third periods. In step S205, the controller 6 sends a start instruction to the supply controller 10. The first period is a period during which the supply controller 10 drives the shutter from the closed state to the opened state in accordance with the start instruction (that is, a period during which the energy supplied to the imprint material 14 increases). Let T1 be the length of the first period, and E1 be the integrated irradiation dose of the light 8 for the imprint material 14 in the first period. For example, when the supply controller 10 drives the shutter by a motor, T1 is determined based on the characteristics of the motor, and E1 is determined based on T1, the shape of the shutter, the intensity of the light 8 generated by the light source 9, and the like.

The second period is a period during which the intensity of the light 8 with which the imprint material 14 is irradiated is maintained constant while the shutter is in the opened state (that is, a period during which the energy supplied to the imprint material 14 is maintained constant). Let T2 be the length of the second period, and E2 be the integrated irradiation dose of the light 8 for the imprint material 14 in the second period.

In step S207 (stop step), the controller 6 sends a stop instruction to the supply controller 10. The third period is a period during which the supply controller 10 drives the shutter from the opened state to the closed state in accordance with the stop instruction (that is, a period during which the energy supplied to the imprint material 14 decreases). Let T3 be the length of the third period, and E3 be the integrated irradiation dose of the light for the imprint material 14 in the third period. For example, when the supply controller 10 drives the shutter by a motor, T3 is determined based on the characteristics of the motor, and E3 is determined based on T3, the shape of the shutter, the intensity of the light 8 generated by the light source 9, and the like. The second period shifts to the third period when the controller 6 sends the stop instruction to the supply controller 10, and the supply controller 10 starts driving of the shutter from the opened state to the closed state in response to the stop instruction.

FIG. 5 exemplifies the driving position (the position in the Z-axis direction) of the mold 7 by the mold moving mechanism 3 for adjusting the interval between the mold 7 and the imprint material 14 on the shot region. The controller 6 controls the mold moving mechanism 3 serving as the adjuster AM so as to start upward movement of the mold 7 to separate the imprint material 14 and the mold 7 after the time at which the shutter of the supply controller 10 is set in the closed state. A period during which the mold 7 is moved from its position (lower position) when it is in contact with the imprint material 14 to the target position (upper position) is set as the fourth period. Let T4 be the length of the fourth period. The period T4 during which an operation of separating the imprint material 14 and the mold 7 is performed is typically longer than the third period T3.

A time Ta required to end upward movement of the mold 7 after the start of irradiation of the imprint material 14 with the light 8 is given by:

$$Ta=T1+T2+T3+T4 \quad (1)$$

In other words, Ta can represent the time from when supply of the energy to the imprint material 14 starts until separation between the imprint material 14 and the mold 7 ends.

An integrated irradiation dose Ea for the imprint material 14 from when irradiation of the imprint material 14 with the light 8 starts until upward movement of the mold 7 starts is given by:

$$Ea=E1+E2+E3 \quad (2)$$

In other words, Ea can represent the integrated supply amount of the energy for the imprint material 14 from when supply of the energy to the imprint material 14 starts until separation between the imprint material 14 and the mold 7 starts.

To sufficiently cure the imprint material 14, Ea has the following relationship with a minimum integrated irradiation dose Eth required to cure the imprint material 14. That is, $$Ea \geq Eth$$

As Ea is larger, the integrated irradiation time Ta is longer. To improve the throughput of the imprint apparatus 1, Ea=Eth is preferably set.

Figure 4:
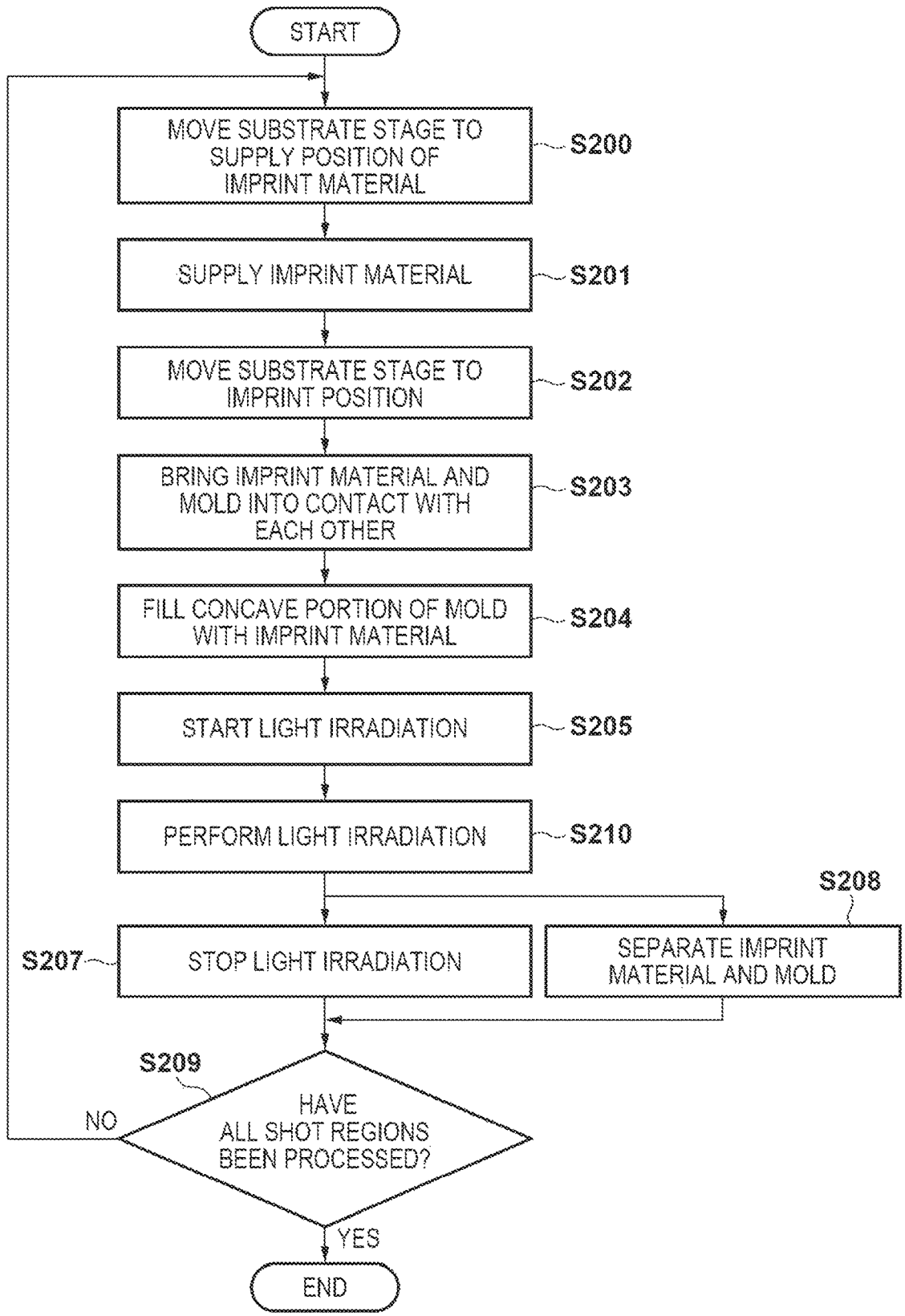
FIG. 4 is a flowchart illustrating the operation of the imprint apparatus in the second mode.

The operation in the second mode will be described below with reference to FIG. 4. The operation in the second mode is the same as that in the first mode up to step S205. In step S210 executed after step S205, to ensure that a predetermined amount of energy is supplied to the imprint material 14, the controller 6 waits until the second wait time (T1+T2+T5 (to be described later)) elapses. The second wait time is determined so that the integrated irradiation dose of the light 8 with which the imprint material 14 is irradiated becomes Eth after the start of irradiation in step S205 and before the expiration of the second wait time.

After step S210, the controller 6 executes step S207 (stop step) and step S208 (separation start step). In step S207, the controller 6 controls the energy supply tool 2 to stop the supply of the energy to the imprint material 14. For example, the controller 6 sends, to the supply controller 10 of the energy supply tool 2, a stop instruction to instruct the stop of the supply of the energy. In accordance with the stop instruction, the supply controller 10 executes an operation for stopping the supply of the energy to the imprint material 14. If the supply controller 10 includes a shutter, it drives the shutter from the opened state to the closed state in accordance with the stop instruction. A corresponding delay occurs from when the supply controller 10 receives the stop instruction until the state of the shutter changes from the opened state to the closed state in response to the stop instruction.

In step S208, the controller 6 causes the adjuster AM to adjust the distance between the substrate holder 13 and the mold holder 17 so as to separate the imprint material 14 and the mold 7, as schematically shown in FIG. 10D. In an example, the controller 6 controls the mold moving mechanism 3 serving as a component of the adjuster AM so as to separate the mold 7 and the imprint material 14 on the shot region as an imprint target, that is, so as to move the mold 7 upward.

Separation between the imprint material 14 and the mold 7 in step S208 can be started after the controller 6 sends the stop instruction to the supply controller 10 of the energy supply tool 2 in step S207 and before irradiation of the imprint material 14 with the light from the energy supply tool 2 stops. Alternatively, after the controller 6 waits in step S210 until the second wait time elapses, separation between the imprint material 14 and the mold 7 in step S208 may be started before the controller 6 sends the stop instruction to the supply controller 10 of the energy supply tool 2 in step S207. As described above, in the second mode, the controller 6 controls the adjuster AM so as to start separation between the imprint material 14 and the mold 7 in a period during which the energy supply tool 2 supplies the energy to the imprint material 14 that is in contact with the mold 7.

After execution of steps S207 and S208, in step S209, the controller 6 determines whether the imprint processing has ended for all the shot regions to which the pattern should be formed. If there is an unprocessed shot region, the controller 6 returns to step S200 to process the unprocessed shot region. If the imprint processing has ended for all the shot regions to which the pattern should be formed, the controller 6 ends the processing shown in FIG. 4 (that is, the processing in step S102 in the second mode).

Figure 6:
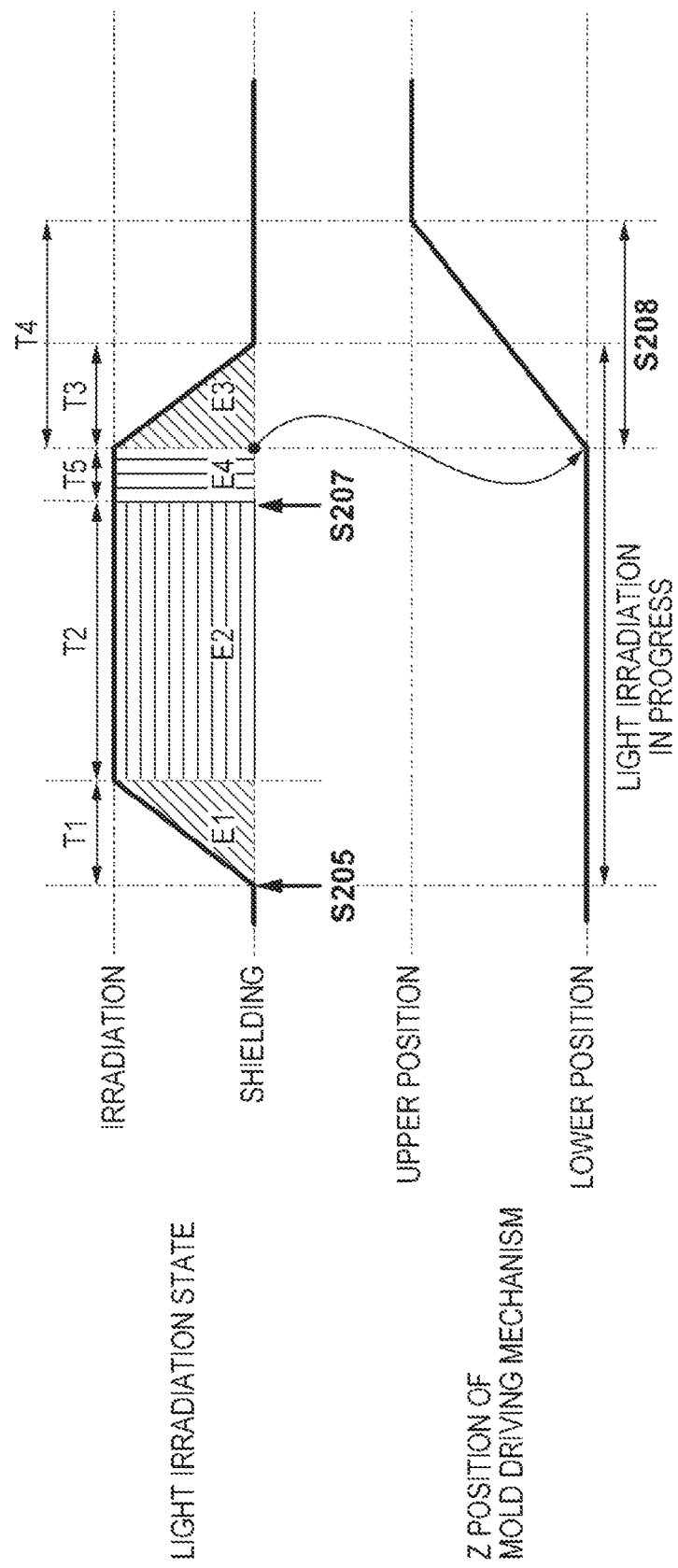
FIG. 6 is a timing chart showing supply of energy (light) to the imprint material and the timing of separation between the resin and the mold in the second mode.

FIG. 6 shows the supply of the energy (light) to the imprint material 14 and the timing of separation between the imprint material 14 and the mold 7 in the second mode. FIG. 6 exemplifies the supply state of the energy by the supply controller 10 of the energy supply tool 2, that is, the light irradiation state. In FIG. 6, "irradiation" indicates a state in which the imprint material 14 is irradiated with light of a target intensity, and "shielding" indicates a state in which the imprint material 14 is not irradiated with light. A section between "irradiation" and "shielding" is a section in which the imprint material 14 is irradiated with light of an intensity lower than the target intensity and, more specifically, a section between the opened and closed states of the shutter of the supply controller 10.

In the second mode as well, a period during which the energy supply tool 2 supplies the energy to the imprint material 14 that is in contact with the mold 7 includes the first, second, and third periods.

The first period is a period during which the supply controller 10 drives the shutter from the closed state to the opened state in accordance with the start instruction sent from the controller 6 in step S205 (that is, a period during which the energy supplied to the imprint material 14 increases). Let T1 be the length of the first period, and E1 be the integrated irradiation dose of the light 8 for the imprint material 14 in the first period. For example, when the supply controller 10 drives the shutter by a motor, T1 is determined based on the characteristics of the motor, and E1 is determined based on T1, the shape of the shutter, the intensity of the light 8 generated by the light source 9, and the like. The first period and its length T1 are respectively equal to those in the first mode.

In the second mode, the second period is a period during which the intensity of the light 8 with which the imprint material 14 is irradiated is maintained constant while the shutter is in the opened state (that is, a period during which the energy supplied to the imprint material 14 is maintained constant). The length of the second period in the second mode is different from that in the first mode. The length of the second period in the second mode is represented by T2+T5. The integrated irradiation dose of the light 8 for the imprint material 14 in the second period in the second mode is represented by E2+E4. Note that T2 and E2 are respectively equal to those in the first mode. T5 and E4 are determined so that the integrated irradiation dose (E1+E2+

E4) in the total period of the first and second periods, that is, the second wait time (T1+T2+T5) becomes Eth. This is intended to sufficiently cure the imprint material 14 before start of separation between the imprint material 14 and the mold 7 in step S207.

The third period is a period during which the supply controller 10 drives the shutter from the opened state to the closed state in accordance with the stop instruction sent from the controller 6 in step S207 (that is, a period during which the energy supplied to the imprint material 14 decreases). Let T3 be the length of the third period, and E3 be the integrated irradiation dose of the light for the imprint material 14 in the third period. For example, when the supply controller 10 drives the shutter by a motor, T3 is determined based on the characteristics of the motor, and E3 is determined based on T3, the shape of the shutter, the intensity of the light 8 generated by the light source 9, and the like. T3 and E3 are respectively equal to those in the first mode. The second period shifts to the third period when the controller 6 sends the stop instruction to the supply controller 10, and the supply controller 10 starts driving of the shutter from the opened state to the closed state in response to the stop instruction.

In the second mode, a time Tb required to end upward movement of the mold 7 after start of irradiation of the imprint material 14 with the light 8 is given by:

$$Tb = T1 + T2 + T5 + T4 \quad (3)$$

In other words, Tb can represent the time from when supply of the energy to the imprint material 14 starts until separation between the imprint material 14 and the mold 7 ends.

An integrated irradiation dose Eb for the imprint material 14 from when irradiation of the imprint material 14 with the light 8 starts until upward movement of the mold 7 starts is given by:

$$Eb = E1 + E2 + E4 \quad (4)$$

In other words, Eb can represent the integrated supply amount of the energy to the imprint material 14 from when supply of the energy to the imprint material 14 starts until separation between the imprint material 14 and the mold 7 starts.

The second mode has as its object to improve the throughput by shortening Tb to a time shorter than Ta in the first mode. To do this, E4 is determined so as to shorten Eb as much as possible, that is, so as to set Eb=Eth. In this case, Ea=Eb=Eth and E3=E4. Furthermore, when E3=E4, T5<T3 holds. Thus, Tb<Ta holds in accordance with equations (1) and (3).

As described above, in the second mode, the time from when supply of the energy to the imprint material 14 starts until separation between the imprint material 14 and the mold 7 ends is shorter than that in the first mode. Therefore, it is possible to improve the throughput by selecting the second mode.

The imprint apparatus 1 may have the third mode as a mode selectable in execution of step S102 in addition to or instead of the first and second modes.

Figure 7:
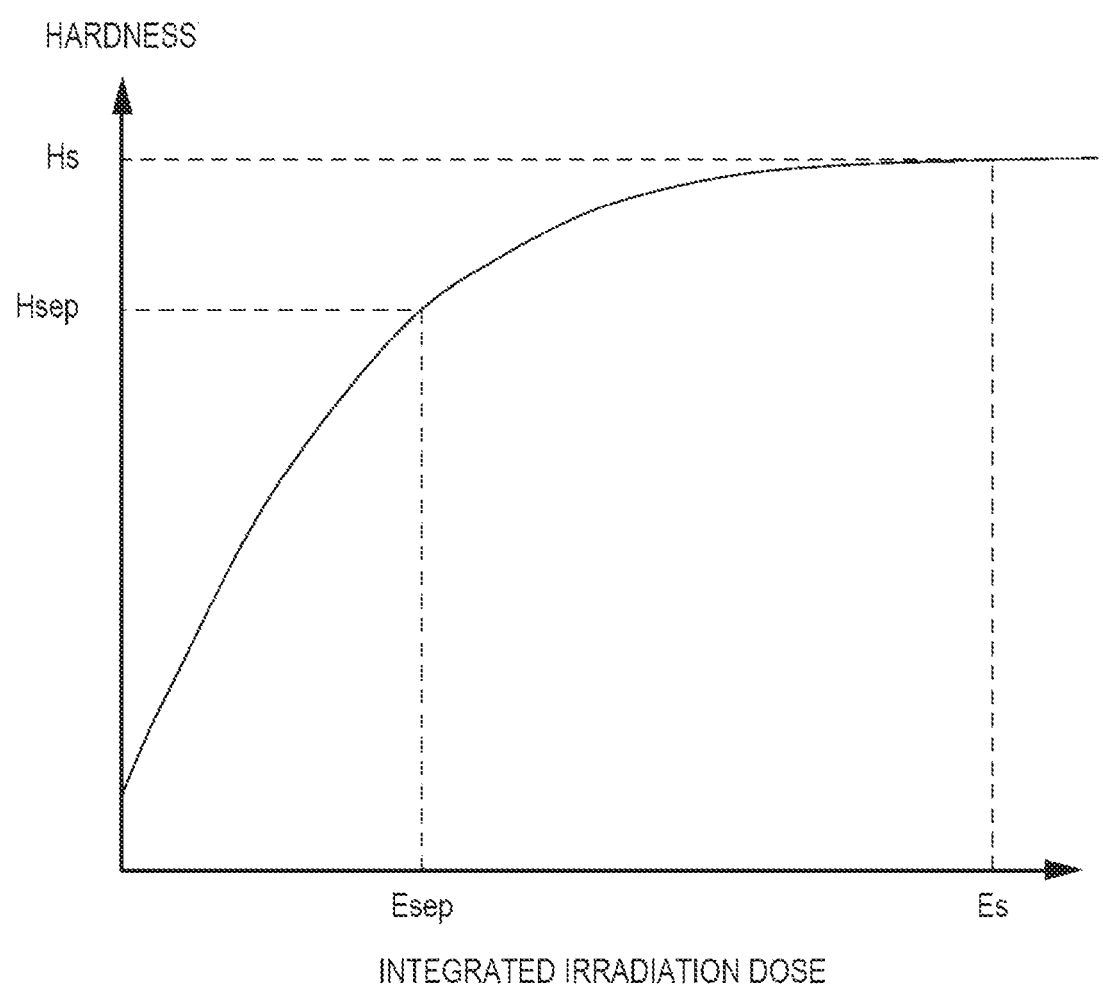
FIG. 7 is a graph exemplifying the property of a photo-curing resin as an example of the imprint material.

FIG. 7 exemplifies the property of a photo-curing resin as an example of the imprint material 14. The abscissa represents the integrated irradiation dose of the light for the imprint material 14 and the ordinate represents the hardness of the imprint material 14. The hardness of the imprint material 14 typically increases along with an increase in the integrated irradiation dose. However, the hardness of the imprint material 14 reaches a hardness Hs at an integrated irradiation dose Es. Even if the imprint material 14 is further irradiated with the light, the hardness hardly changes. In the imprint processing, the imprint material 14 and the mold 7 may be preferably separated after the hardness of the imprint material 14 reaches the hardness Hs. However, it may be possible to separate the imprint material 14 and the mold 7 before the hardness of the imprint material 14 reaches the hardness Hs. A thermosetting resin can have such property.

Consider a case in which it is possible to separate the imprint material 14 and the mold 7 when the imprint material 14 has a hardness Hsep lower than the hardness Hs. Assume that the hardness Hsep is obtained when the integrated irradiation dose reaches an integrated irradiation dose Esep. The hardness Hsep can depend on the dimensions of the pattern to be formed, the property of the imprint material 14, and the like. In the third mode, when the integrated irradiation dose reaches the integrated irradiation dose Esep, separation between the imprint material 14 and the mold 7 is started.

Figure 8:
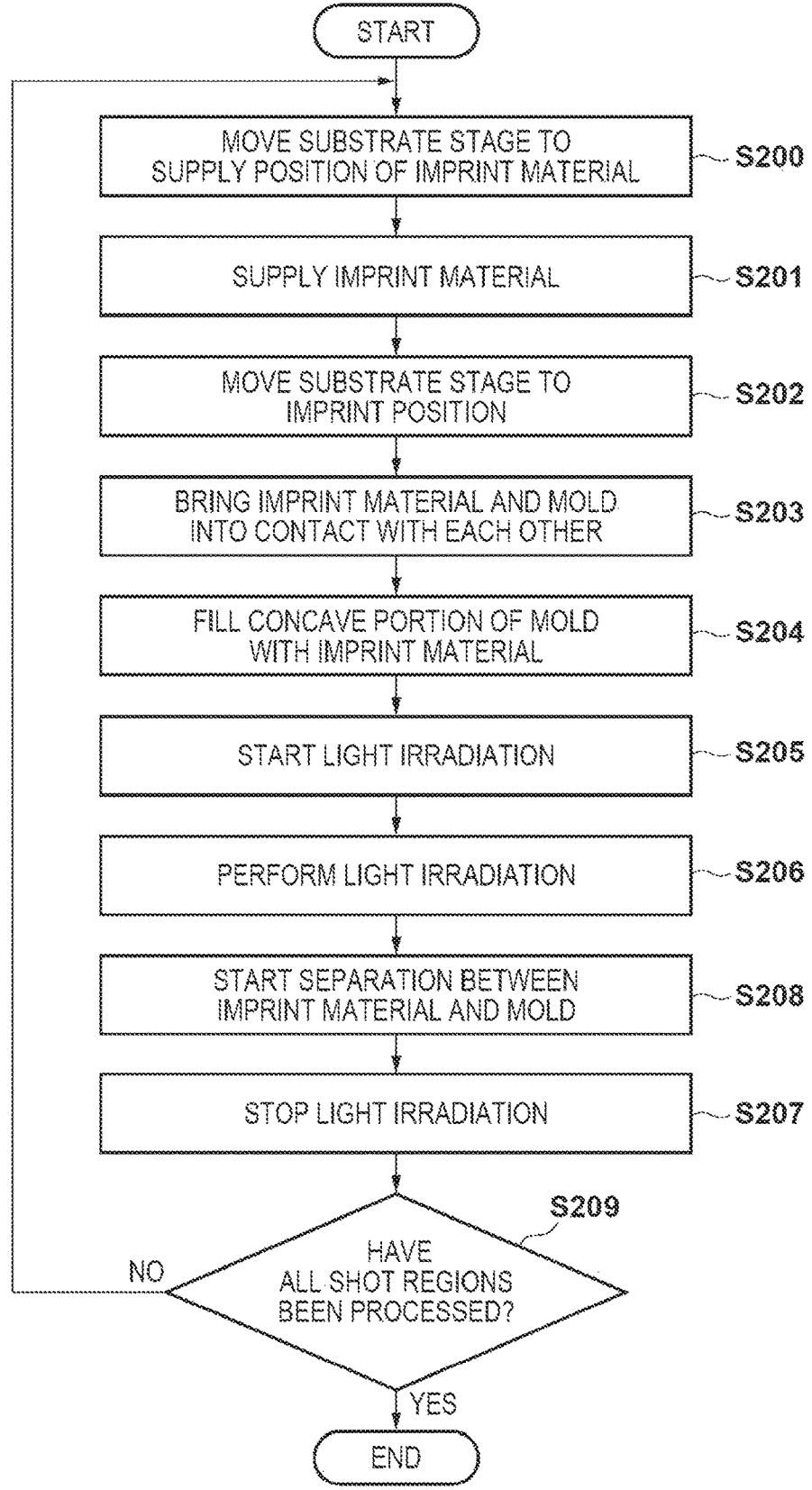
FIG. 8 is a flowchart illustrating the operation of the imprint apparatus in the third mode.
Figure 9:
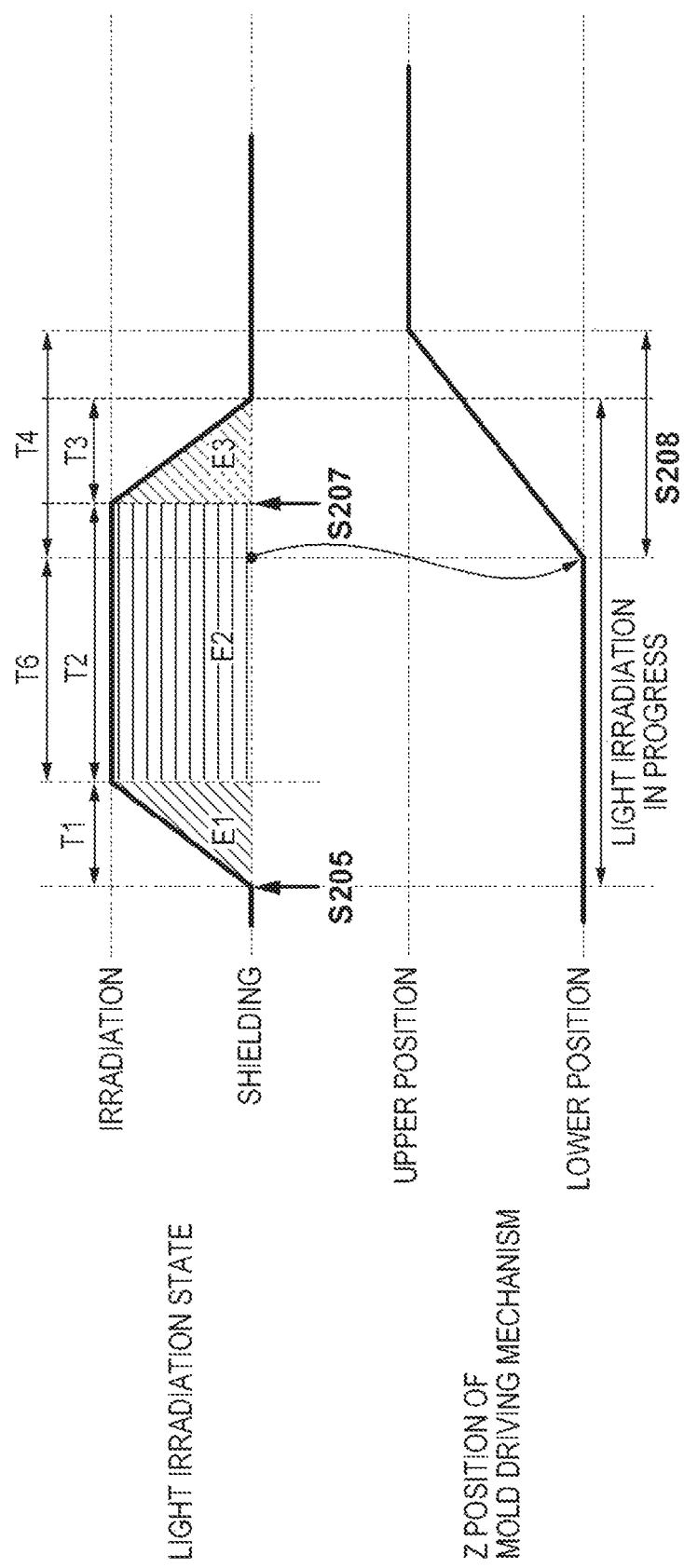
FIG. 9 is a timing chart showing supply of energy (light) to the imprint material and the timing of separation between the resin and the mold in the third mode.

An operation in the third mode will be described with reference to FIGS. 8 and 9. The operation in the third mode is the same as that in the first mode up to step S205. In step S206 executed after step S205, to ensure that the hardness of the imprint material 14 reaches the hardness Hsep at which separation between the imprint material 14 and the mold 7 is possible, the controller 6 waits until the third wait time (T1+T6 in FIG. 9) elapses. The third wait time is a time necessary for the integrated irradiation dose to reach Esep. In other words, the third wait time can represent a time required to supply, to the imprint material 14, energy necessary to make the hardness of the imprint material 14 reach the hardness Hsep.

When the third wait time elapses, the controller 6 causes, in step S208, the adjuster AM to adjust the distance between the substrate holder 13 and the mold holder 17 so as to separate the imprint material 14 and the mold 7, as schematically shown in FIG. 10D. In an example, the controller 6 controls the mold moving mechanism 3 serving as a component of the adjuster AM so as to separate the mold 7 and the imprint material 14 on the shot region as an imprint target, that is, so as to move the mold 7 upward. Even after the start of upward movement of the mold 7, the energy supply tool 2 supplies the energy to the imprint material 14.

After that, in step S207, the controller 6 controls the energy supply tool 2 to stop the supply of the energy to the imprint material 14. For example, the controller 6 sends, to the supply controller 10 of the energy supply tool 2, a stop instruction to instruct the stop of the supply of the energy. In accordance with the stop instruction, the supply controller 10 executes an operation for stopping the supply of the energy to the imprint material 14. If the supply controller 10 includes a shutter, it drives the shutter from the opened state to the closed state in accordance with the stop instruction. A corresponding delay occurs from when the supply controller 10 receives the stop instruction until the state of the shutter changes from the opened state to the closed state in response to the stop instruction. As described above, in the third mode, after the controller 6 causes the adjuster AM to start separation between the imprint material 14 and the mold 7 in step S208, it sends the stop instruction to the energy supply tool 2 in step S207.

In the third mode as well, a period during which the energy supply tool 2 supplies the energy to the imprint material 14 that is in contact with the mold 7 includes the first, second, and third periods. The definitions of the first, second, and third periods comply with those in the first mode. The second period shifts to the third period in response to the stop instruction, and the controller 6 causes the adjuster AM to start separation between the imprint material 14 and the mold 7 in the second period.

In step S209, the controller 6 determines whether the imprint processing has ended for all the shot regions to which the pattern should be formed. If there is an unprocessed shot region, the controller 6 returns to step S200 to process the unprocessed shot region. If the imprint processing has ended for all the shot regions to which the pattern should be formed, the controller 6 ends the processing shown in FIG. 8 (that is, the processing in step S102 in the third mode).

In the third mode, a time Tc required to end upward movement of the mold 7 after start of irradiation of the imprint material 14 with the light 8 is given by:

$$Tc = T1 + T6 + T4 \quad (5)$$

In other words, Tc can represent the time from when supply of the energy to the imprint material 14 starts until separation between the imprint material 14 and the mold 7 ends. Note that the third wait time is represented by T1+T6, and is obtained by subtracting T1 from the time necessary to obtain the integrated irradiation dose Esep.

Since T6<T2 holds, Tc<Tb holds. The third mode is more advantageous than the second mode in terms of the throughput.

An article manufacturing method will be described below. A method of manufacturing a device (for example, a semiconductor integrated circuit device or a liquid crystal display device) as an article includes a step of forming a pattern on a substrate (a wafer, a glass plate, or a film-shaped substrate) using the above-described imprint apparatus. The manufacturing method can also include a step of processing (for example, etching) the substrate with the pattern being formed. Note that when manufacturing another article such as a pattered medium (recording medium) or an optical device, the manufacturing method can include another process of processing the substrate with the pattern being formed in place of etching. The article manufacturing method according to this embodiment is superior to a conventional method in at least one of the performance, quality, productivity, and production cost of the article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-142385, filed Jul. 16, 2015, which is hereby incorporated by reference herein in its entirety.

The invention claimed is:

1. An imprint apparatus for curing an imprint material on a substrate held by a substrate holder by bringing a mold held by a mold holder into contact with the imprint material, the apparatus comprising:

an adjuster configured to adjust a distance between the substrate holder and the mold holder for contact and separation between the imprint material and the mold;

an energy supply tool configured to irradiate the imprint material on the substrate with light for curing the imprint material; and a controller configured to control the adjuster and the energy supply tool, wherein the controller is configured to control the adjuster so as to start separating the imprint material and the mold from each other by increasing the distance between the substrate holder and the mold holder before an end of a continuous irradiation period during which the imprint material that is in contact with the mold is continuously irradiated with the light for curing the imprint material by the energy supply tool and to control the energy supply tool, in the continuous irradiation period, to irradiate the imprint material with the light for curing the imprint material during at least a part of the separating of the imprint material and the mold from each other, and wherein the controller is configured to provide an amount of irradiation with the light for curing required to cure the imprint material until separation between the imprint material and the mold ends.

2. The apparatus according to claim 1, wherein the energy supply tool starts an operation for stopping the irradiating of the imprint material in response to a stop instruction from the controller, and the controller controls the adjuster so as to start separating the imprint material and the mold from each other after the stop instruction is sent to the energy supply tool and before the irradiating the imprint material by the energy supply tool stops.

3. The apparatus according to claim 1, wherein the continuous irradiation period includes a first continuous irradiation period during which an irradiation amount of the light to the imprint material increases, a second continuous irradiation period during which the irradiation amount is maintained constant, and a third continuous irradiation period during which the irradiation amount decreases, and the controller controls the adjuster so as to start separating the imprint material and the mold from each other in response to a shift from the second continuous irradiation period to the third continuous irradiation period.

4. The apparatus according to claim 3, wherein a period during which an operation of separating the imprint material and the mold is longer than the third continuous irradiation period.

5. The apparatus according to claim 1, wherein
the energy supply tool starts an operation for stopping the irradiating of the imprint material in response to a stop instruction from the controller, and
the controller sends the stop instruction to the energy supply tool after causing the adjuster to start separating the imprint material and the mold from each other.

6. The apparatus according to claim 5, wherein
the continuous irradiation period includes a first continuous irradiation period during which an irradiation amount of the light to the imprint material increases, a second continuous irradiation period during which the irradiation amount is maintained constant, and a third continuous irradiation period during which the irradiation amount decreases,
the second continuous irradiation period shifts to the third continuous irradiation period in response to the stop instruction, and
the controller causes the adjuster to start separating the imprint material and the mold from each other in the second continuous irradiation period.

7. The apparatus according to claim 6, wherein a period during which an operation of separating the imprint material and the mold is longer than the third continuous irradiation period.

* * * * *